United States Patent [19]
Guidash et al.

[11] Patent Number: 5,591,997
[45] Date of Patent: Jan. 7, 1997

[54] LOW CAPACITANCE FLOATING DIFFUSION STRUCTURE FOR A SOLID STATE IMAGE SENSOR

[75] Inventors: Robert M. Guidash, Rush; Herbert J. Erhardt; Eric G. Stevens, both of Rochester, all of N.Y.

[73] Assignee: Eastman Kodak Company, Rochester, N.Y.

[21] Appl. No.: 373,691

[22] Filed: Jan. 17, 1995

[51] Int. Cl.$^6$ .......................... H01L 31/062; H01L 31/12
[52] U.S. Cl. .......................... 257/290; 257/291; 257/292; 257/293; 257/296; 257/300; 257/301; 257/431; 257/459; 257/532; 257/773; 257/776; 437/3; 437/50; 437/53; 437/175
[58] Field of Search ...................... 257/290, 291, 257/293, 296, 300, 301, 431, 459, 532, 773, 776; 437/3, 50, 53, 175

[56] References Cited

U.S. PATENT DOCUMENTS 5,387,536   2/1995   Guidash et al. .......................... 437/3

OTHER PUBLICATIONS

K. Miwada, et al, "A 100 MHz Data–Rate, 5000–element CCD Linear Image Sensor with Reset Pulse Level Adjustment Circuit", IEEE Int. Solid–St. Circ. Conf. Tech. Digest, pp. 168–169, 275, 1992.
U.S. Patent Application Serial No. 08/188,500, Filed Jan. 26, 1994, entitled Low Capacitance Floating Diffusion Structure for a Solid State Image Sensor by R. M. Guidash and A. S. Ciccarelli.

*Primary Examiner*—Edward Wojciechowicz
*Attorney, Agent, or Firm*—James D. Leimbach

[57] ABSTRACT

This invention concerns a novel structure to create a low capacitance floating diffusion without changing or adding steps to the image sensor fabrication process. It consists of incorporation of a novel structure at the contact area between the floating diffusion and the gate electrode that reduces the junction capacitance of the floating diffusion and improves the sensitivity of the device (the structure features overlapping contact, gate, metalization and n-type regions which provide the electrical contact between the floating diffusion and the gate). Additionally, the structure has a low resistance diffusion region that is self aligned with a gate electrode.

19 Claims, 4 Drawing Sheets

5,591,997

LOW CAPACITANCE FLOATING DIFFUSION STRUCTURE FOR A SOLID STATE IMAGE SENSOR

BACKGROUND OF THE INVENTION

1. Field of the Invention

This invention relates to solid state photo-sensors and imagers and, more particularly, to charge-to-voltage conversion structures of charge coupled devices.

2. Description of the Prior Art

Solid state photo-sensors and imagers operate by converting incident optical energy into charge packets that are spatially correlated to the incident optical image. In order to reconstruct and/or store the image in another medium, the photo-charge is typically converted to voltage. This is usually accomplished by transferring the photo-charge onto an integrated capacitor. The charge is thus converted to a voltage by the relationship, V=Q/C; where V is voltage, Q is charge, and C is capacitance.

In an application where light levels are low, (such as copiers), it is desirable to make this capacitance as small as possible so that the sensitivity, which is defined as dV/dQ, is sufficiently large to provide an adequate output voltage swing with these lower illumination levels. To this end, the capacitor is typically realized by a floating diffusion. This is typically achieved by employing a floating diffusion to create the capacitor and realize the necessary voltage swing. The floating diffusion is typically formed by a shallow implant and contacted via metalization that connects the floating diffusion to the gate of a MOS transistor used as an amplifier. The capacitance of the floating diffusion node is increased by the parasitic capacitance that is associated with the metalization interconnect and the MOS transistor. Therefore, in order to keep the total capacitance resulting at the floating diffusion node small, it is desirable to minimize this parasitic capacitance as well as to reduce the junction capacitance of the floating diffusion region.

One method to minimize the parasitic capacitance, was presented by K. Miwada, et. al., "A 100 MHz Data-Rate, 5000-Element CCD Linear Image Sensor with Reset Pulse Level Adjustment Circuit", IEEE Int. Solid-St. Circ. Conf. Tech. Digest, pp. 168–169, 275, 1992. In this approach a "buried contact" is created that eliminates the need for any metal interconnect between the floating diffusion and the gate of the MOS amplifier. This approach however, has some disadvantages. First it requires the addition of an extra mask and lithography sequence to the baseline image sensor process. It also requires either direct contact of the gate oxide with photoresist, or additional process steps to prevent direct contact. As a result, the yield and cost of the device is adversely affected.

An improved low capacitance floating diffusion structure was devised and disclosed by R. M. Guidash and A. S. Ciccarelli in U.S. application Ser. No. 08/188,500 filed Jan. 26, 1994 and entitled "A Low Capacitance Floating Diffusion Structure for a Solid State Image Sensor and Method for Producing Such a Structure", which is commonly assigned with the present invention. In this structure the contact area with the floating diffusion is formed through an opening in a gate electrode. This structure overcomes the disadvantages cited in the prior art, but still places some limitations on the reduction in the floating diffusion area contained between the reset gate and output gate. The junction capacitance of the floating diffusion structure is directly proportional to this area. In order to further reduce the floating diffusion junction capacitance it is desirable to make the floating diffusion region between the reset gate and output gate smaller.

As can be seen by the foregoing description, there remains a need within the prior art for a floating diffusion structure that has reduced capacitance from existing structures.

SUMMARY OF THE INVENTION

This invention concerns a novel structure to create a low capacitance floating diffusion without changing or adding steps to the image sensor fabrication process. It consists of incorporation of a novel structure at the contact area between the floating diffusion and the gate electrode that reduces the junction capacitance of the floating diffusion and improves the sensitivity of the device (the structure features overlapping contact, gate, metalization and n-type regions which provide the electrical contact between the floating diffusion and the gate). Additionally, the structure has a low resistance diffusion region that is self aligned with a gate electrode.

The present invention overcomes the previously discussed disadvantages within the prior art devices, where the minimum size for the floating diffusion is limited by the requirement of nesting contacts within diffusion or gate electrode regions, while maintaining all of the improvements provided by the prior art structure as shown in FIG. 1. This limitation imposes a constraint on further reduction of floating diffusion junction capacitance.

It is an object of the present invention to provide a floating diffusion structure having minimal capacitance.

It is still further an object of the present invention to create a floating diffusion structure that is physically smaller than previous floating diffusions.

It is still further an object of the present invention to disclose co-overlapping areas as a means of achieving a smaller floating diffusion area and a reduction in capacitance of the floating diffusion.

It is yet still further an object of the present invention to create a floating diffusion area having minimal capacitance requiring few or no additional process steps.

DETAILED DESCRIPTION

Figure 2B:
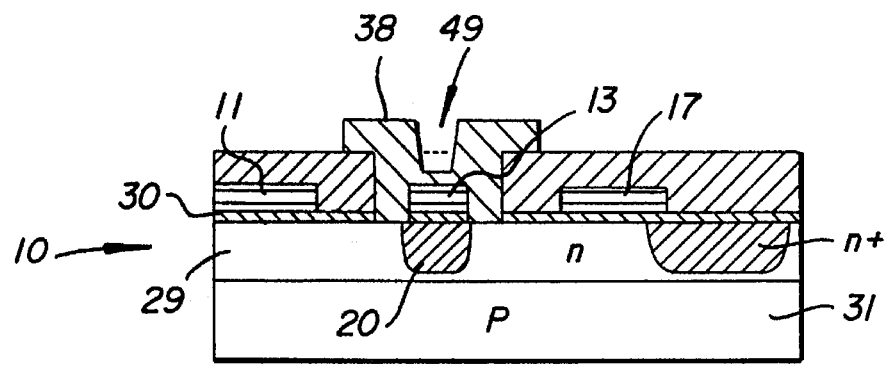
FIG. 2b is a cross sectional diagram of the floating diffusion structure envisioned by the present invention as shown in FIG. 2a taken along the line AA.
Figure 2A:
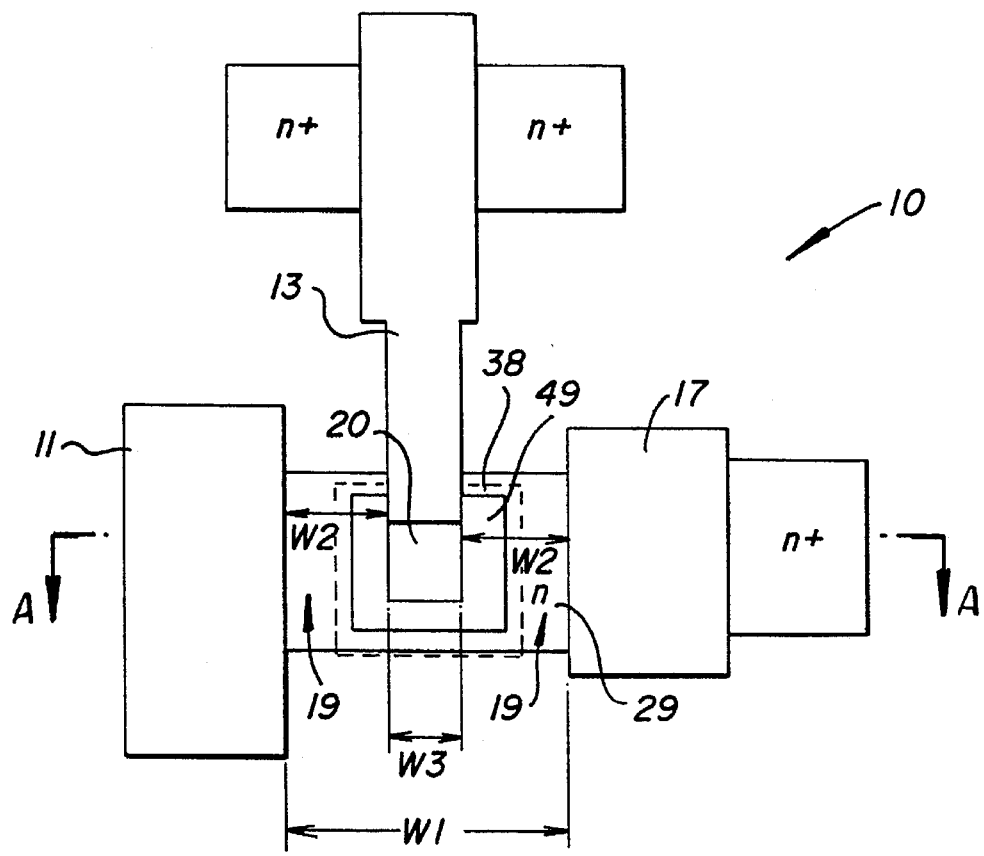
FIG. 2a is a top view of the floating diffusion structure envisioned by the present invention.

Referring to FIG. 2a, which is a top view of the floating diffusion structure 10 envisioned by the present invention, that employs a novel structure designed to provide a contact 49 between the n-type region 29 and a gate electrode 13, while reducing the area of the floating diffusion 19, without changing or adding steps to the image sensor fabrication process. It comprises incorporation of contact 49 and interconnect 38 regions that co-overlap at least a portion of the gate electrode 13 and n-type region 29. With this structure, the junction capacitance of the floating diffusion 19 is reduced over that of the prior art, and improves the sensitivity of the device.

Figure 1B:
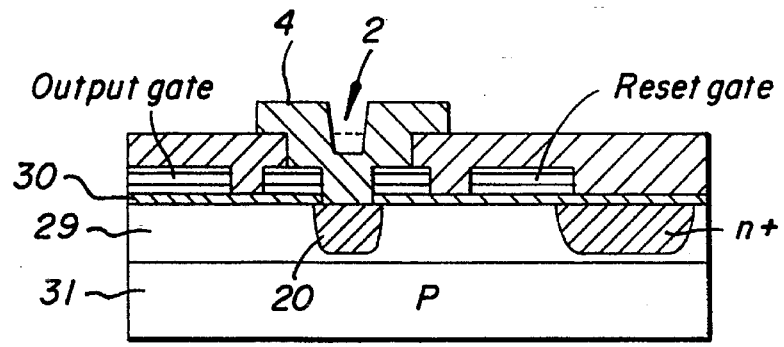
FIG. 1b is a cross sectional diagram of the diagram shown in FIG. 1a taken along the line AA.
Figure 1A:
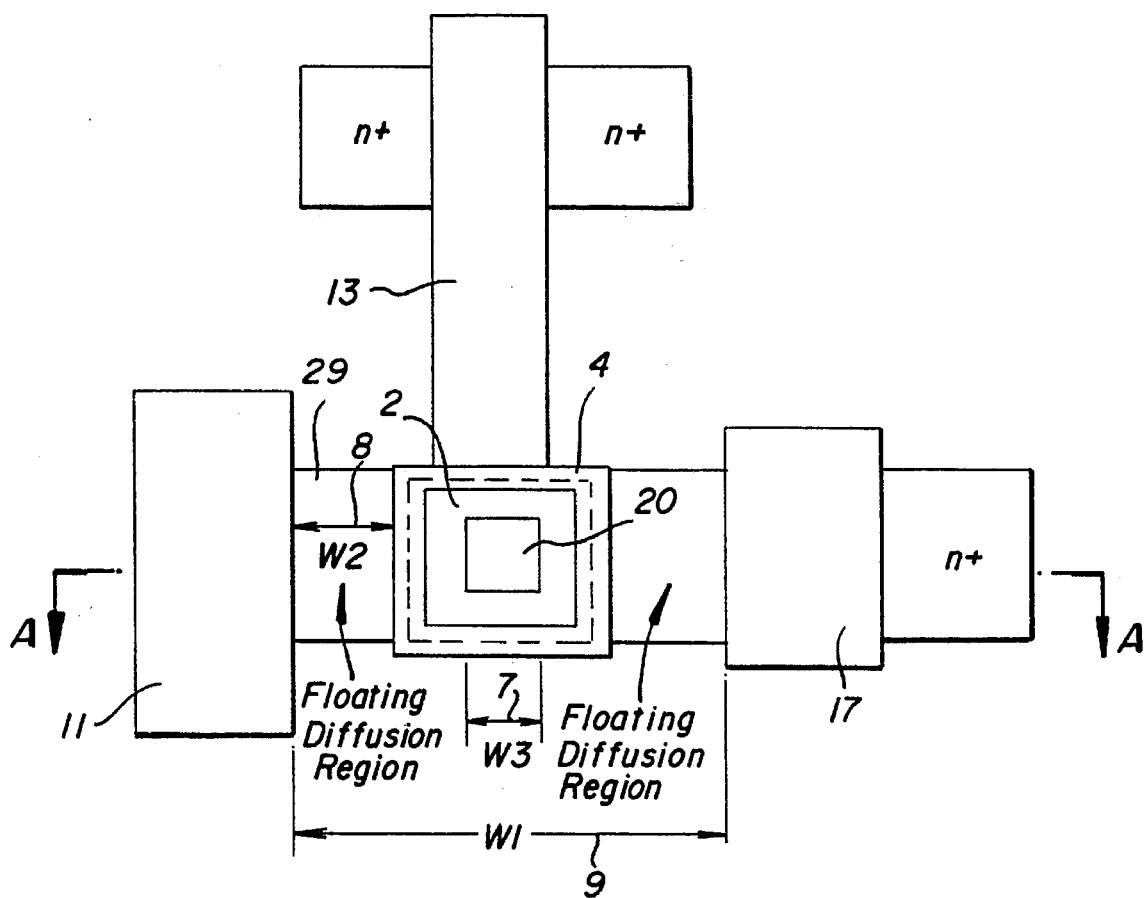
FIG. 1a is a top view illustrating a prior art device for reduced floating diffusion capacitance.

As previously discussed, the device of FIG. 1a and FIG. 1b described an improved low capacitance floating diffusion structure. The n-type region 29 between the output gate 11 and reset gate 17 is generally referred to as the floating diffusion 19. A disadvantage of this structure is that the length of the floating diffusion 9, distance W1 shown in FIG. 1, is limited by having to maintain a given distance W2 as indicated in FIG. 1. The total distance W1 is given by Equation 1:

$$W1=2(W2)+3(W3) \qquad \text{Equation 1}$$

A certain W2 must be maintained so to minimize electrode to electrode capacitance and coupling. W3 is determined by the minimum feature size that can be patterned for a given process technology. This limitation imposes a constraint on further reduction of the area of the floating diffusion, and consequently the floating diffusion junction capacitance.

This present invention, as shown in FIG. 2, and that of the prior art in FIG. 1 shall be referred to by the same reference numbers only where the item referred to is identical. Referring to FIG. 2, the present invention overcomes the aforementioned limitation within the length of the floating diffusion 9 within FIG. 1, while maintaining all of the improvements provided by the structure in FIG. 1. This is accomplished by using contact 49 and interconnect 38 regions that co-overlap at least a portion of the gate electrode 13 and floating diffusion 19. Additionally, an n+-type region 20 can be employed to achieve a low resistance (ohmic), connection between the gate electrode 13 and floating diffusion 19. This n+ region 20 overlaps at least a portion of the contact region 49 that is within the floating diffusion 19, and does not increase the size of the structure 10.

The invention consists of using the existing image sensor fabrication process/sequence to provide an improved floating diffusion structure 10. This structure reduces the capacitance associated with the interconnect to the MOS amplifier as well as the junction capacitance of the floating diffusion 19.

With this scheme, the floating diffusion 19 is formed by an n-type region 29 that is still confined between the output gate 11 electrode and the reset gate 17 electrode as shown by the device of FIG. 1a and FIG. 1b. However, this region can be reduced over the prior art by use of the aforementioned co-overlapping scheme, which does not require formation of a hole in the gate electrode. As a result the capacitance attributable to the floating diffusion 19 is minimized.

Referring to FIG. 2, to define the N+ region 20, the gate electrode 13, and low resistance N+20 are patterned so that the low resistance N+ region 20 is self-aligned to the gate electrode 13 in at least one direction, (preferably towards the direction of interconnect to the output amplifier), and overlaps the n-type floating diffusion 19. This is entirely different from the prior art approach illustrated in FIG. 1 wherein a hole is patterned in the gate electrode 13.

The contact 49 and interconnect 38 areas are formed in a similar manner with co-overlapping regions to the gate electrode 13 and n-type region 29, to connect the floating diffusion 19 to the gate electrode 13 as shown in FIG. 2.

Due to the architecture of the present invention, as shown in FIGS. 2a and 2b, the width W1 reduced by the factor of 2×(W3) as compared to the prior art shown in FIGS. 1a and 1b. This results because the hole patterned in the electrode of FIGS. 1a and 1b requires 3* (W3) to fabricate a single W3 for the hole, and another W3 on each side of the hole. By eliminating the hole in FIGS. 1a and 1b the present invention requires only a single W3 to fabricate.

With this structure the minimum W1 is given by Equation 2:

$$W1=2(W2)+W3 \qquad \text{Equation 2}$$

This is 2(W3) less than that provided by the structure in FIG. 1.

Any number of specific embodiments can be devised, but all are realized by formation of contact 49, and interconnect 38 regions that co-overlap at least a portion of the gate electrode 13, and floating diffusion 19. The preferred embodiment has the gate electrode, 13, overlapping the floating diffusion, 19, however, the structure can be realized by having the gate electrode, 13, and floating diffusion, 19, adjacent to one another and not overlapping. Still further embodiments can be realized by inclusion of an N+ region 20 that also co-overlaps at least a portion of the gate electrode 13 and floating diffusion 19.

The preferred method by which the structure of the present invention is constructed is illustrated in FIG. 3a through FIG. 3k.

Figure 3A:
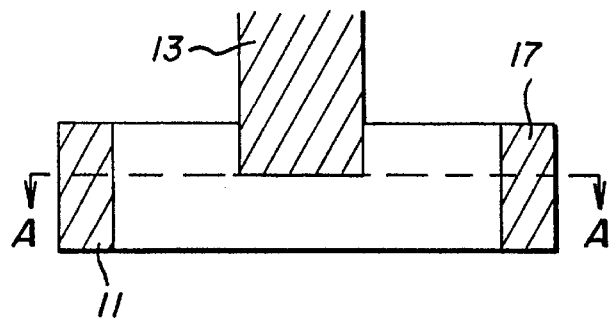
FIG. 3a is a top view of electrodes being formed on a device conceived by the present invention.
Figure 3B:
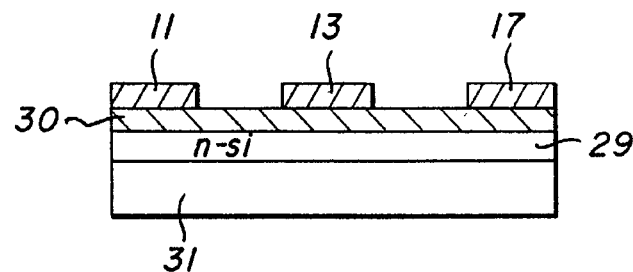
FIG. 3b is a front cross-sectional view of FIG. 3a as seen through the line AA.

Referring to FIG. 3a, which is a top view of a portion of the floating diffusion structure 10 as conceived by the present invention, wherein, output gate electrode 11, amplifier gate electrode 13, and reset gate electrode 17 are formed on device 10 using conventional patterning techniques. As previously mentioned, the region between output gate 11 and reset gate 17 is generally referred to as the floating diffusion 19. The premise of the present invention is to reduce the minimum size of the floating diffusion 19, thereby, reducing the junction capacitance associated with the floating diffusion 19. FIG. 3b is a front cross-sectional view of FIG. 3a as seen through the line AA. The layers used to create device 10 can readily be seen as a p-type substrate 31 with an n-type region 29, and gate oxide 30. Electrodes 11, 13, 17 are formed on gate oxide 30 as seen in FIG. 3b.

Figure 3C:
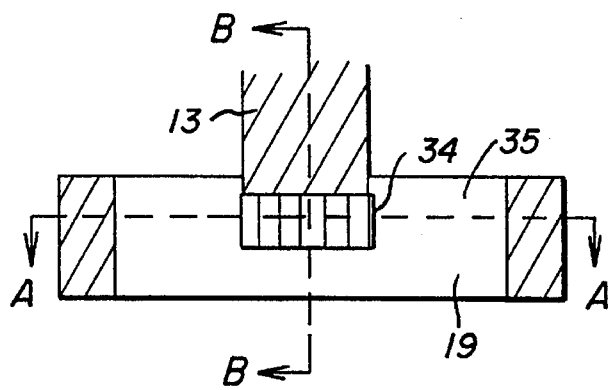
FIG. 3c is a top view of the structure of FIG. 3a with the additional step of having a photoresist material patterned to create a low resistance area adjacent to an electrode within the floating diffusion.

FIG. 3c is a top view of the next sequential step in the process of making device 10, wherein, the structure of FIG.

3a has a window 34 formed in photoresist material 35, which overlaps a portion of gate electrode 13 and the floating diffusion 19 of device 10. The function of this window is allow introduction of additional n-type impurities to form a low resistance area adjacent to the gate electrode 13, within the floating diffusion 19.

Figure 3D:
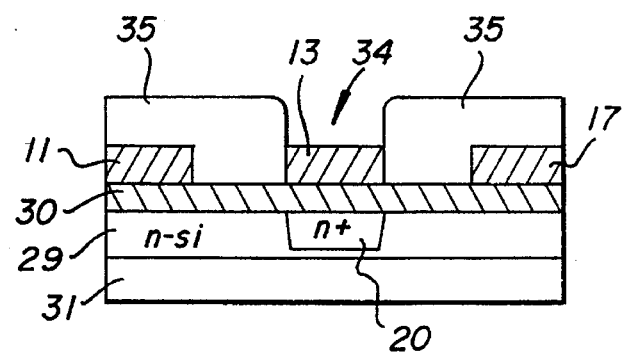
FIG. 3d is a cross-sectional view of FIG. 3c as seen through the line AA.

FIG. 3d is a cross-sectional view of FIG. 3c as seen through the line AA wherein window 34 can be seen cross-sectionally. In the preferred embodiment, arsenic is used to implant the low resistance area within the floating diffusion 19 by implanting through the window 34 surrounding electrode 13. The result is an N+°implant 20 adjacent to electrode 13.

Figure 3E:
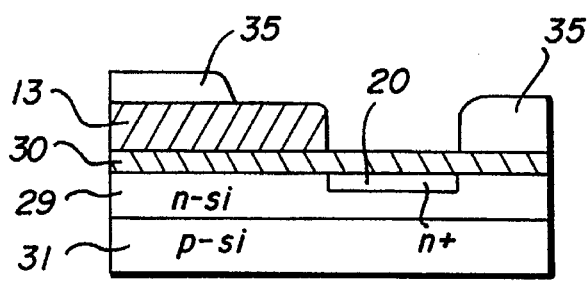
FIG. 3e is a cross-sectional diagram of FIG. 3c as seen through the line BB.

FIG. 3e is a cross-sectional diagram of FIG. 3c as seen through the line BB. Here, the relative placement of the various layers can be seen as well as the electrode in relation to the low resistance area formed by the arsenic implantation discussed above. The N+ region is formed in the portion of window 34, within the photoresist 35, that does not overlap the gate electrode 13.

Figure 3F:
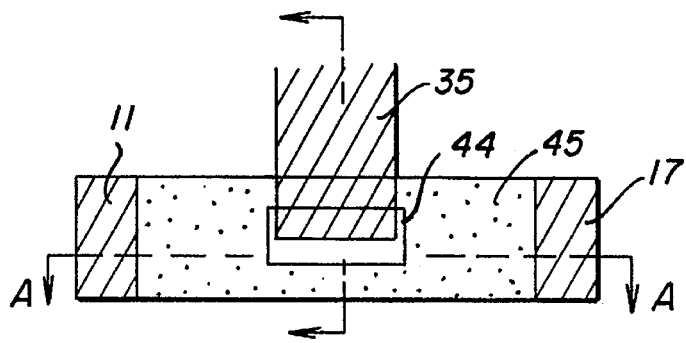
FIG. 3f is a top view of the structure of FIG. 3c with the additional process step of having a an oxide applied and etched to create a contact region.
Figure 3G:
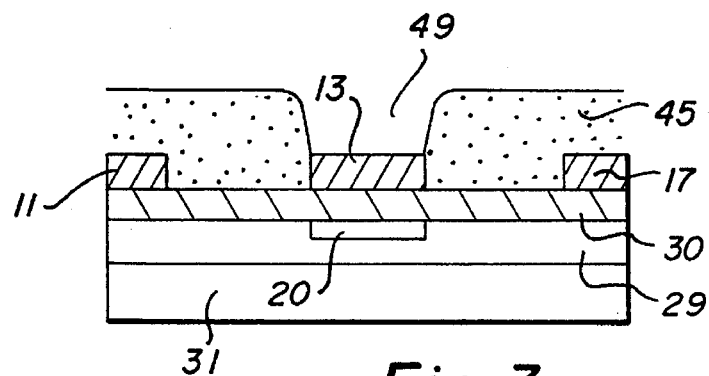
FIG. 3g is a cross-sectional view of FIG. 3f as seen through the line AA.

FIG. 3f is a top view of the structure of FIG. 3c with the subsequent process step of having a an oxide 45 applied and etched such that another window 44 is left open within the oxide 45. FIG. 3g is a cross-sectional view of FIG. 3f as seen through the line AA where the relative placement of oxide 45 and window 44 can be seen from this vantage point.

Figure 3H:
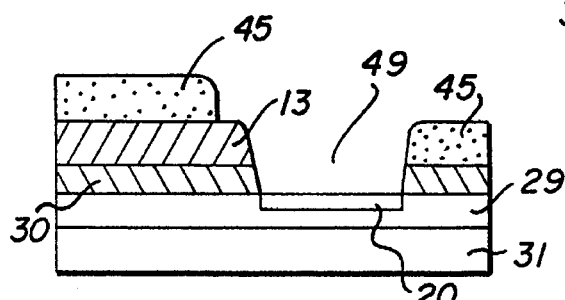
FIG. 3h is a cross-sectional diagram of FIG. 3f as seen through the line BB.

FIG. 3h is a cross-sectional diagram of FIG. 3f as seen through the line BB where it can be seen that the oxide 45 is deposited, patterned and etched to leave window 44 which is used to provide an opening generally referred to as the contact region 49 that overlaps a portion of the gate electrode 13, and floating diffusion 19. If an N+ region 20 is used, this area is also overlapped.

Figure 3I:
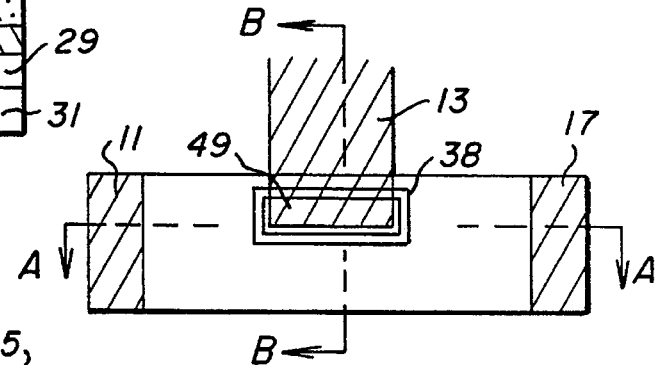
FIG. 3i is a top view of the structure of FIG. 3f illustrating the additional step of applying a conductor to create an ohmic contact.
Figure 3J:
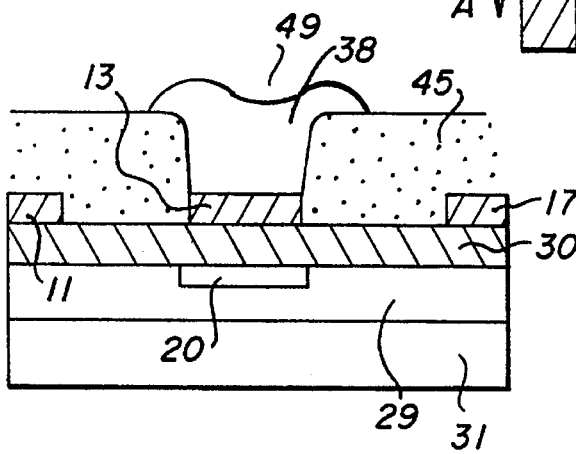
FIG. 3j is a cross-sectional view of FIG. 3i as seen through the line AA.
Figure 3K:
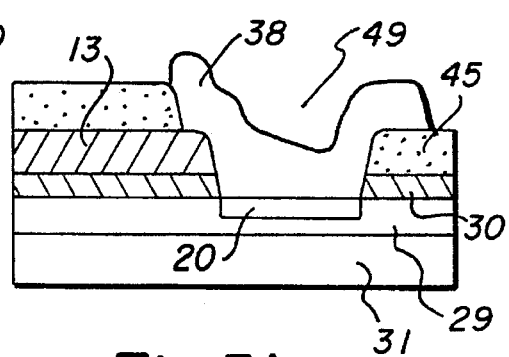
FIG. 3k is a cross-sectional diagram of FIG. 3i as seen through the line BB.

FIG. 3i is a top view of the structure of FIG. 3f illustrating the step of applying a conductor 38 to create an electrical connection within the contact region 49 between the floating diffusion 19 and the gate electrode 13. The electrical connection is more clearly illustrated by viewing FIG. 3j, which is a cross-sectional view of FIG. 3i as seen through the line AA and FIG. 3k, where 3k is a cross-sectional diagram of FIG. 3i as seen through the line BB. Here, these cross sections illustrate the connection that is made between the floating diffusion 19 and the gate electrode 13. If the N+ region 20 is used, then the electrical connection is an ohmic connection.

As indicated above, the present invention provides a method and apparatus for reducing the junction capacitance of a floating diffusion structure. These advantages, as identified and discussed in the previous sections, can be employed using conventional image sensor fabrication techniques, without requiring additional steps.

While the inventors have detailed an embodiment illustrating their most preferred embodiment of employing the present invention, numerous obvious variations will be apparent to those skilled in the relevant arts. Therefore, the present invention should be measured by appended claims.

Parts List

1 N+ implant (prior art)
2 Existing contact (prior art)
3 prior art gate electrode
4 Existing interconnect (prior art)
5
6
7 W3 (prior art )
8 W2 (prior art )
9 floating diffusion
10 floating diffusion structure (present invention)
11 output gate
12 window
13 amplifier gate electrode
14
15
16
17 reset gate electrode
18
19 floating diffusion
20 N+ implant
21
22
23
24
25
26
27
28
29 N-type region
30 gate oxide
31 p-type substrate
32
33
34 window within photo-resist
35 photo-resist material
36
37
38 Existing interconnect
39
40
41
42
43
44 oxide window
45 oxide
46
47
48
49 contact region

What is claimed is:

1. A solid state photo sensor having an output amplifier with a gate electrode provided on a substrate of a first conductivity type comprising:

a floating diffusion of a second conductivity type opposite the first conductivity type;

a contact region patterned such that an opening is formed that overlaps both the floating diffusion region and at least a portion of an outside edge of the gate electrode; and means for creating an electrical connection between the floating diffusion and the gate electrode within the contact region.

2. The sensor of claim 1 wherein the means for creating an electrical connection comprises a conductive material within the contact region such that it overlaps portions of the gate electrode and the floating diffusion region.

3. The sensor of claim 1 wherein the substrate is a p-type substrate.

4. The sensor of claim 3 wherein the floating diffusion is an n-type floating diffusion.

5. The sensor of claim 4 further comprising a low resistance area formed at least partially within the contact region to provide a low resistance ohmic connection between the floating diffusion and the gate electrode.

6. The sensor of claim 5 wherein the low resistance area is formed from an N+ type material.

7. The sensor of claim 1 wherein the substrate is an N-type and the floating diffusion is a P-well structure.

8. The sensor of claim 1 wherein the sensor is a charge coupled device having an output gate electrically coupled to both the floating diffusion and the charge coupled device.

9. The sensor of claim 1 wherein the sensor is an active pixel sensor having floating diffusion structures and amplifiers at each pixel.

10. The sensor of claim 1 wherein the contact region comprises multiple isolated contact openings, such that at least one of the isolated openings overlaps at least a portion of one external edge of the gate electrode, and at least one of the isolated openings overlaps the floating diffusion.

11. The structure of claim 1 wherein the contact region is patterned such that it is adjacent to and abutting the gate electrode.

12. The sensor of claim 10 further comprising a low resistance area formed at least within a portion of the contact region that overlaps the floating diffusion to provide low resistance ohmic connection between the floating diffusion and the gate electrode.

13. The sensor of claim 12 wherein the low resistance area is formed from an N+ type material.

14. A method for creating a low capacitance floating diffusion structure within a solid state image sensor having an output amplifier provided with a gate electrode upon a substrate of a first conductivity type comprising the steps of:

forming a floating diffusion in the substrate from a second conductivity type that is opposite to the first conductivity type of the substrate;

forming a gate oxide on the substrate;

forming the gate electrode for said output amplifier such that it overlaps said floating diffusion;

forming a contact region over the gate electrode and the floating diffusion, that overlaps a portion of the floating diffusion and at least a portion of one outside edge of said gate electrode, filling at least a portion of said contact region with a conductive material to provide an electrical connection between the gate electrode and the floating diffusion.

15. The method of claim 14 wherein a low resistivity region is introduced at least within a portion of the contact region.

16. The method of claim 15 wherein the first conductivity type is a P-type material, the second conductivity type is an N-type material, and the low resistivity region is an N+ region.

17. The method of claim 16 wherein the preliminary creating step employs photoresist patterning techniques to form the window around the portion of the electrode.

18. The method of claim 14 wherein the gate electrode is patterned such that it does not overlap the floating diffusion.

19. The structure of claim 1 wherein the gate electrode is patterned such that it does not overlap the floating diffusion.

* * * * *